United States Patent
Lee

(10) Patent No.: US 9,136,870 B2
(45) Date of Patent: Sep. 15, 2015

(54) METHOD AND APPARATUS WITH ERROR CORRECTION FOR DIMMABLE VISIBLE LIGHT COMMUNICATION

(71) Applicant: SAMSUNG ELECTRONICS CO., LTD., Suwon-si, Gyeonggi-do (KR)

(72) Inventor: Sang Hyun Lee, Hwaseong-si (KR)

(73) Assignee: Samsung Electronics Co., Ltd., Gyeonngi-Do (KR)

( * ) Notice: Subject to any disclaimer, the term of this patent is extended or adjusted under 35 U.S.C. 154(b) by 240 days.

(21) Appl. No.: 13/893,808

(22) Filed: May 14, 2013

(65) Prior Publication Data

US 2013/0308954 A1    Nov. 21, 2013

Related U.S. Application Data

(60) Provisional application No. 61/647,008, filed on May 15, 2012.

(30) Foreign Application Priority Data

Dec. 11, 2012   (KR) .................. 10-2012-0143177

(51) Int. Cl.
*H04L 27/00* (2006.01)
*H03M 13/00* (2006.01)
*H04B 10/116* (2013.01)
*H03M 13/29* (2006.01)

(52) U.S. Cl.
CPC ........ *H03M 13/005* (2013.01); *H03M 13/2957* (2013.01); *H03M 13/6362* (2013.01); *H04B 10/116* (2013.01)

(58) Field of Classification Search
CPC ..... H03M 13/00; H03M 13/03; H03M 13/05; H03M 13/09; H03M 13/095; H03M 13/27; H03M 13/2703; H03M 13/2757; H03M 13/2778; H03M 13/005; H03M 13/2957; H03M 13/6362; H04B 10/116

See application file for complete search history.

(56) References Cited

U.S. PATENT DOCUMENTS

| | | | |
|---|---|---|---|
| 8,009,550 B2 * | 8/2011 | Dottling et al. | 370/208 |
| 2003/0221156 A1 * | 11/2003 | Berger et al. | 714/755 |
| 2008/0175603 A1 * | 7/2008 | Son et al. | 398/212 |

FOREIGN PATENT DOCUMENTS

| | | |
|---|---|---|
| JP | 2010-056644 | 3/2010 |
| KR | 10-2003-0097358 | 12/2003 |
| KR | 10-2011-0057906 | 6/2011 |
| KR | 10-2011-0083961 | 7/2011 |

* cited by examiner

*Primary Examiner* — Dac Ha
(74) *Attorney, Agent, or Firm* — Harness, Dickey & Pierce, P.L.C.

(57) ABSTRACT

An apparatus and method using error correcting for visible light communication are provided. The error correction includes generating an encoded message from an original message by using a predetermined coding method, puncturing the encoded message based on a determined dimming value or rate, and/or puncturing rate, generating a scrambled message by scrambling the punctured message, and providing the scrambled message to a visible light source.

19 Claims, 5 Drawing Sheets

METHOD AND APPARATUS WITH ERROR CORRECTION FOR DIMMABLE VISIBLE LIGHT COMMUNICATION

CROSS-REFERENCE TO RELATED APPLICATIONS

This application claims the benefit under 35 U.S.C. §119(e) of U.S. Provisional Application No. 61/647,008, filed on May 15, 2012, in the U.S. Patent and Trademark Office, and the benefit under 35 U.S.C. §119(a) of Korean Patent Application No. 10-2012-0143177, filed on Dec. 11, 2012, in the Korean Intellectual Property Office, the entire disclosures of which are incorporated herein by reference.

BACKGROUND

1. Field

One or more embodiments relate to a method and apparatus for dimmable visible light communication (VLC) with error correction, and more particularly, to a technology for error correction using puncturing and scrambling in a broadcasting communication path of which intensity is adjustable.

2. Description of the Related Art

Recently, there has been wide spread use of light emitting diodes (LEDs) due to improvements in emission efficiency and reductions in the prices of LEDs.

Visible light communication (VLC) refers to a communication technology that transmits information to a receiver using visible light, such as light having a wavelength of about 400 to 700 nm, for example. In such VLC systems, information may be transmitted by flickering visible light, e.g., by an LED, at high frequencies. The frequency of the flickering may be controllable based upon a clock speed.

As only an example, a corresponding lighting device of a VLC system may be connected to a power line communication system, for example, that provides high-speed Internet through a power consent, e.g., through permission based distribution algorithms that determine efficient spectrum access, so that access to the Internet is achieved through a communication path between Internet ready devices and the light transmitting device, such as a visible path. As only an example, in such permission based distribution based algorithms, a primary user may permit secondary users access to a resource (spectrum) as long as they consent to aiding the primary user as a relay in addition to transmitting their own data. In this example, the high-speed Internet may be provided to the VLC system from a power line provided high-speed Internet so as to extend Internet access to such Internet ready devices by using the VLC system. Conventionally, such extensions have been provided by wireless local area networks (LANs). However, VLC may be more stable than the wireless LAN because information may be more easily lost through a wireless connection than VLC.

Also, VLC is typically harmless to a human body since it may use a light that, as generated or propagated, is harmless to the human body. Furthermore, obtaining frequency permissions may be necessary for wireless LANs, while such frequency permissions may not be necessary with VLC. In addition, recently the interest in VLC has increased due to limitations or the exhaustion of available radio frequency (RF) band frequencies, possibility of crossover among different types of wireless communication technologies, an increasing demand for security, and the like.

Therefore, research is being conducted for VLC by various enterprises and laboratories. In addition, there is further interest in increases in technology that may permit increases in available data transmission rates of VLC systems.

As noted above, in VLC systems information may be transmitted by flickering visible light, e.g., by an LED. The average intensity of the flickering visible light may adapt to a dimming requirement chosen by a user, which may be achieved through various transmission schemes at the modulation level. One example scheme is on-off keying (OOK), where a ratio of "ON" time to "OFF" time is adjusted in a transmission frame to meet such a dimming requirement. For example, 70% "ON" may be needed for a 70% dimming requirement. However, few VLC approaches have addressed error correction schemes that satisfy such requirements in OOK-based VLC systems. Furthermore, those schemes that do address error correction are generally based on special algebraic structures of constant weights. This results in only a limited number of dimming rates being allowed, so the adaptation to arbitrarily set dimming rates is not possible. Also, code rates are scaled with $O(\log N \div N)$ for a codeword of length N, so high code rates cannot be achieved. Basically, existing schemes exploit the constant weight property of specific codes. Since those schemes exclude the all-zero codeword, the resulting binary codes are non-linear. In addition, since the constant weight property of algebraic codes generally limits the code rates too strictly, code rates scale with $O(\log N \div N)$, which renders the coding scheme impractical except for very small N. Accordingly, existing schemes have limited code rate options as they scale with $O(\log N \div N)$ for codewords of length N. In addition, such existing schemes require separately designed and dedicated encoding/decoding methods for respective different dimming rates, with such dedicated decoding methods decreasing overall performance.

SUMMARY

One or more embodiments provide a visible light communication method, the method including encoding a information message using a predetermined error correction coding scheme that has a bit length N different from a bit length of the information message, puncturing the encoded message based on a desired dimming rate and a set pattern, with the punctured message including non-punctured bits and punctured bits, generating a scrambled message by scrambling the non-punctured bits of the punctured message and combining the scrambled non-punctured bits with the punctured bits of the punctured message, and providing the scrambled message to a visible light source.

One or more embodiments provide visible light communication system, the system including a encoding unit to encode a information message using a predetermined error correction coding scheme that has a bit length N different from a bit length of the information message, a puncturing unit to puncture the encoded message based on a desired dimming rate and a set pattern, with the punctured message including non-punctured bits and punctured bits, and a scrambled generating unit to generate a scrambled message by scrambling the non-punctured bits of the punctured message and combining the scrambled non-punctured bits with the punctured bits of the punctured message.

Additional aspects and/or advantages will be set forth in part in the description which follows and, in part, will be apparent from the description, or may be learned by practice of one or more embodiments of the present invention.

BRIEF DESCRIPTION OF THE DRAWINGS

These and/or other aspects and advantages will become apparent and more readily appreciated from the following description of one or more embodiments, taken in conjunction with the accompanying drawings of which.

DETAILED DESCRIPTION

Figure 1:
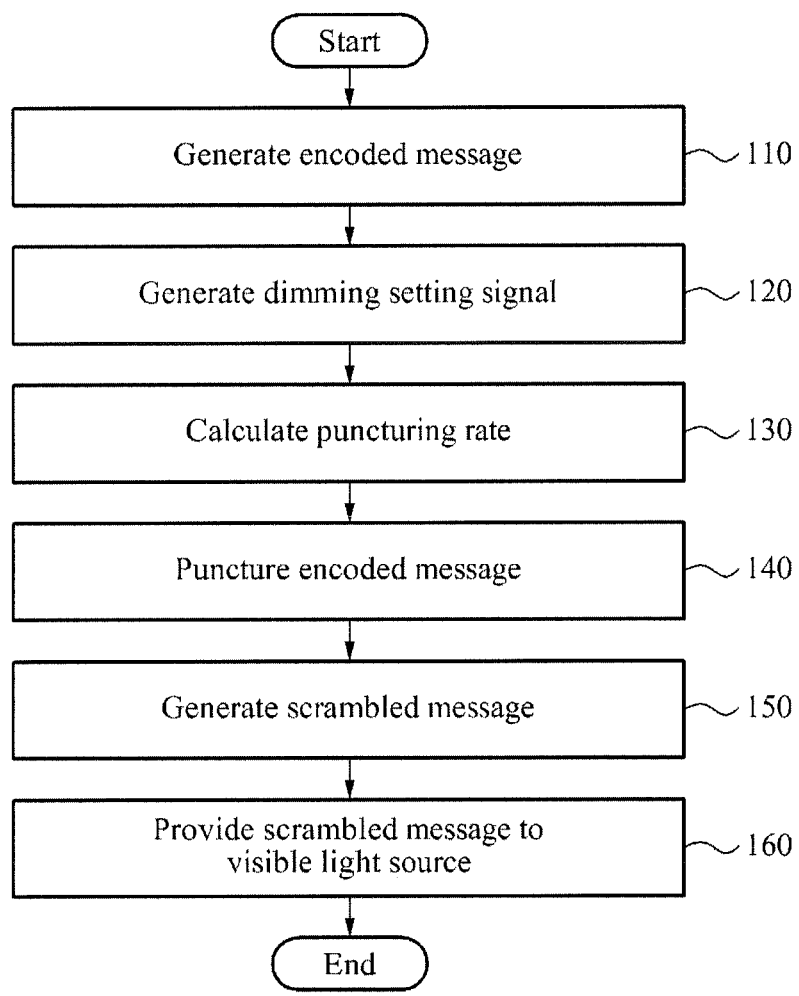
FIG. 1 illustrates an error correction method for visible light communication (VLC), according to one or more embodiments.

Reference will now be made in detail to one or more embodiments, illustrated in the accompanying drawings, wherein like reference numerals refer to like elements throughout. In this regard, embodiments of the present invention may be embodied in many different forms and should not be construed as being limited to embodiments set forth herein. Accordingly, embodiments are merely described below, by referring to the figures, to explain aspects of the present invention.

One or more embodiments present a dimmable visible light communication (VLC) system with an error correction scheme that may provide dimming control through on-off keying, and which may yield a codeword with a codeword weight adapted to a dimming requirement. One or more embodiments further permit for an arbitrary value of the dimming requirement. One or more embodiments further set forth a dimmable VLC system with an error correction scheme where turbo codes are employed together with puncturing and scrambling techniques, e.g., to match the Hamming weight of codewords with the desired dimming rate.

Accordingly, one or more embodiments includes a dimmable turbo code-based error correction scheme that is combined with puncturing and scrambling, providing one or more of the following benefits: 1) iterative decoding algorithms of a trellis-based encoding scheme herein, e.g., convolutional codes or turbo codes, allow for better decoding performance over existing coding schemes devised for VLC systems; 2) the robustness to puncturing generated errors by a trellis-based encoding scheme for turbo codes, for example, herein facilitates the support for arbitrary dimming rates, with such a trellis-based encoding scheme further preventing performance degradation induced by the puncturing; 3) a single encoding/decoding method may be used for various dimming rates which leads to the ease of implementation, while existing schemes require dedicated encoding/decoding methods for different dimming rates; and 4) one or more of the proposed coding schemes supports various code rates, while □ existing schemes have limited code rate options that must scale with O(log N÷N) for codewords of length N. In addition, according to one or more embodiments, performance of the proposed coding scheme is much better than that of existing coding schemes by more than 2 dB or has as much as a 20-fold gain in the code rate. Thus, according to one or more embodiments, an error correction method and apparatus for encoding and decoding is provided.

In one or more embodiments, the encoding process may be a coding scheme of K information bits of an original message, e.g., for eventual OOK modulation using a codeword of length N. A result of the encoding process of the K information bits may be a codeword having a length of N bits. In an embodiment, transmitted symbols of a fraction equal to a desired dimming rate are turned "ON" and the remaining symbols are turned "OFF". For example, mathematically, for a desired dimming rate of $d(0 \le d \le 1)$, each ultimately transmitted codeword may have Nd binary one bits and N(1−d) binary zero bits out of N total codeword symbols.

FIG. 1 illustrates an error correction method for VLC, according to one or more embodiments.

Referring to FIG. 1, in one or more embodiments, error correction for VLC may include generating an encoded message from an original message by using a predetermined encoding method, in operation 110. Here, the original message refers to a message including information to be transmitted by VLC that uses such error correction described herein. In one or more embodiments, the original message may include K information bits.

To forward the original message along a communication path using VLC, an encoding process may be desired.

Accordingly, in one or more embodiments, an encoded message may be generated by trellis-based turbo coding the received K information bits. 'Trellis' refers to a technology for increasing an encoding gain by reducing a detection error during decoding, e.g., by maximizing a Euclidian distance between signals during encoding. When a trellis-based error correcting coding is used to encode the original message, performance levels through the communication path may be maintained even when puncturing is performed, i.e., by countering the potential for errors that are typically generated by puncturing processes. In one or more embodiments, when such puncturing is performed when general encoding methods are used for encoding the original message, e.g., other than such a coding as the trellis-based coding, such as a hamming or related encoding method, there may be a reduction in the performance level through the communication path caused by the decoding of the correspondingly encoded message. Conversely, as noted, when the trellis-based encoding is used, performance levels may be maintained even during the decoding of the encoded message since the trellis-based encoding is very resistant against puncturing generated errors.

Error correction codes based on trellis-based encoding may include a convolutional code and a turbo code, for example. In one or more embodiments, by using error correction in VLC, performance levels may be higher when the turbo code is used than when the convolutional code is used. In one or more embodiments, as only an example, a turbo code may be an error correction code capable of obtaining a maximum transmission rate theoretically possible, using junction of at least two convolutional codes.

Accordingly, for increased performance, the encoded message may be generated using a turbo coding performed with respect to the original message. Here, the encoded message may be a sequence of bits, for example. In one or more embodiments, when the original message includes a K-number of information bits, an N-bit encoded message, e.g., an N-bit codeword, may be generated by turbo coding. As only an example, in one or more embodiments, the information of K-bits may represent an initial codeword or symbol having a length of K bits, so the encoding of this initial codeword by the turbo coding would result in a new codeword having a length of N bits.

In operation 120, a dimming setting signal for setting dimming (intensity) of a visible light source may be generated, e.g., based upon user input or default settings. As only an example, to control the visible light source a binary one may be used to control an emission time of the visible light source while a binary zero may be used to control an extinction time of the visible light source. Accordingly, in one or more embodiments, the ratio between the emission time and the extinction time may be determined based on the dimming setting signal. In one or more embodiments, when a dimming ratio is 70%, e.g., based on the dimming setting signal, the total number of binary ones may be about 70% of all bits for a particular time period while the total number of binary zeros may be about 30% of all bits for the particular time period, for example.

Additionally, the dimming setting signal may also correspond to a user set desired dimming value, which may include desired dimming value levels. As only an example, when a desired dimming value of the visible light source is not provided by the user, the dimming setting signal may be generated using a predetermined default value for the dimming value. For example, when a user does not set the dimming value, the desired dimming value may be set to the predetermined default value.

Rather, when a desired dimming value of the visible light source is provided to a corresponding VLC system, e.g., through a user interface of the VLC system, the dimming setting signal may be generated based on the provided desired dimming value. As only an example, the desired dimming value may be provided by the user using a controller, e.g., for controlling the visible light source of the VLC system or the overall VLC system. In one or more embodiments, the dimming value may be changed by the user at any time, e.g., resulting in changes to the dimming setting signal. Accordingly, the visible light source may be differently controlled according to the desired dimming value every time the desired dimming value is changed by the user. According to the one or more embodiments, for example, the received desired dimming value, and corresponding dimming setting signal, may not change until the user newly sets the desired dimming value.

In addition, a puncturing rate may be calculated or determined corresponding to the desired dimming value, in operation 130. In one or more embodiments, the calculated or determined puncturing rate may be relied upon during the subsequent puncturing and/or scrambling operations, or the puncturing rate may not be calculated or determined and the subsequent puncturing and/or scrambling operations may merely rely on the dimming setting signal, representing the dimming rate or value.

For example, in one or more embodiments, puncturing may be applied to ensure that a resulting transmitted N-bit codeword meets a desired diming rate d. As discussed above, the dimming setting signal may include information on a desired dimming value or ratio. The desired dimming value may represent a desired number of dimming levels and/or respective level values, though the desired number of dimming levels and/or respective level values may be different depending on respective different types of visible light sources that are used to generate the visible light. For example, whereas a desired dimming value of a particular visible light source may be set to have five levels, a desired dimming value of another visible light source may be set to have seven levels. However, according to the one or more embodiments, error correction may be applied that is not dependent on the types of the visible light source, by converting a provided or determine desired dimming value into a desired dimming rate. Alternatively, the dimming rate may be provide by the user or set based upon default values. In one or more embodiments, the desired dimming rate, denoted by d, may be in a range between 0 and 1. Mathematically, if the entire length of an ultimately transmitted message is made to be N bits, e.g., matching the length of the encoded message, the number of binary ones may be Nd bits and the number of binary zeros may be N(1−d) bits.

In operation 130, a puncturing rate may be generated based on the desired dimming rate. As will be described hereinafter, in one or more embodiments, the encoded message may be punctured so that a ratio of the binary ones and the binary zeros making up a scrambled message, e.g., as generated in operation 150, correspond to the desired dimming rate, which is based on the puncturing rate. As to the puncturing of the encoded message, since a number of bits of the encoded message are identified for removal, i.e., punctured bits in the puncturing process, based on the puncturing rate, the puncturing rate may be calculated based on the desired dimming rate. In one or more embodiments, puncturing is applied to ensure that a resulting transmitted N-bit codeword meets the desired dimming rate d. For puncturing rate p, Np symbols out of the encoded message, e.g., N-bit codeword symbols, are designated for removal or punctured in a set arbitrary pattern, e.g., known to both the broadcaster and the receiver, so that systematic information bits remain intact. Thus, N(1−p) bits remain, as "remaining bits", in the codeword after puncturing. In an embodiment, the punctured or removed bits may be set to binary zeros, as such bits have been identified for removal, so an ultimately punctured message may include binary ones and zeros of remaining bits and binary zero bits of punctured or removed bits. For example, the punctured message may include the N(1−p) remaining bits, including binary ones and zeros, and Np punctured bits.

As noted, the desired dimming rate and the puncturing rate may be expressed by the below Equation 1, for example.

$$d = \frac{1-p}{2} \qquad \text{Equation 1}$$

Here, d may denote a desired dimming rate and p may denote the puncturing rate. Thus, the puncturing rate may be controlled according to the desired dimming rate. When a new desired dimming value is received, e.g., as provided or input to a corresponding VLC system by a user or to an error correction apparatus of such a VLC system, the desired dimming rate is changed. Accordingly, the puncturing rate may also be controlled to change according to the desired dimming rate. In one or more embodiments, when the desired dimming rate is 0.2, the puncturing rate may be 0.6. When the desired dimming rate is increased to 0.4, by a change in the desired dimming value, the puncturing rate may be 0.2. Thus, since the puncturing rate is controlled according to the desired dimming rate, the desired dimming rate may be set to any value between 0 and 1.

Thus, the encoded message may be punctured based on the puncturing rate, in operation 140. Here, the puncturing may refer to a method of removing a particular bit according to a predetermine rule. As noted above, a puncturing of a generally encoded message, e.g., not generated by trellis based turbo coding, may result in errors being generate during the puncturing process. However, as also noted above, when a message is encoded by turbo coding, for example, the encoded message is resistant to errors generated by the puncturing. Therefore, though the encoded signal is punctured, the error generation rate of the punctured message may be reduced over other encoding techniques.

In addition, the puncturing may be performed according to the calculated puncturing rate calculated based on the desired dimming rate, e.g., because the dimming of the visible light source according to the desired dimming value may need to be maintained during communication. Therefore, when the desired dimming value is changed, the puncturing rate is accordingly changed. As a result, the ratio of the remaining bits of the punctured message, i.e., the non-punctured bits of the punctured message, to the punctured bits of the punctured message may be changed.

With respect to the encoded message, in one or more embodiments, regions of the encoded message corresponding to the puncturing rate may be punctured, i.e., identified for removal, according to a set arbitrary pattern. Here, for example, when the puncturing rate is calculated, the number of bits corresponding to the puncturing rate may be determined. For example, when the length of the encoded message is N bits and the puncturing rate is p, Np bits are punctured or identified as being 'removed' by the puncturing process. However, such regions of the encoded message from which bits are set for removal may differ depending on the encoded visible light due to the arbitrary pattern. As noted above, in an embodiment, the puncturing of a bit may be represented by setting the punctured bit to the binary zero, so that an ultimate punctured message has a bit length of N with N(1−p) remaining binary ones and zero bits and Np punctured binary zero bits.

When the puncturing is not performed according to the arbitrary pattern, such as when the punctured message is generated using a regular pattern, flickering of the light generated by visible light source may be observable to a user due to the regularity of such puncturing of the encoded message. When the flickering of the visible light source is detected by a user, this means that a performance level of the visible light source is low. Accordingly, to prevent flickering of the visible light source, the puncturing may be performed using the set arbitrary pattern. In addition, when the arbitrary pattern is used, there may be an increase in the probability that the information bits included in the encoded message are not removed in puncturing, i.e., there is an increase in probability that the information bits are included in the remaining bits of the punctured message.

According to the one or more embodiments, the arbitrary pattern may be a pattern existing in turbo code encoding techniques. Also, depending on embodiment, the error correction may include predetermining the arbitrary pattern that should be used.

As noted, as a result of the puncturing performed based on the puncturing rate p with respect to the encoded message of N bits, the number of remaining bits, i.e., the bits identified as not being removed, of the punctured message may be N(1−p) bits, and the number of punctured bits may being Np bits. In one or more embodiments, since the puncturing is capable of being performed using arbitrary patterns, combinations of ones and zeros making up the punctured message may be randomly distributed rather than regularly distributed.

A scrambled message may be generated by scrambling the remaining bits, i.e., the non-punctured bits, of the punctured message, in operation 150. The scrambling may refer to a bitwise masking of a binary sequence with respect to a particular binary sequence different from the binary sequence, performed to generate a new binary sequence. Here, generally, the new binary sequence may be used for multiplexing and respective security between multiple users that may be using the corresponding VLC system, e.g., to access the Internet, and such scrambling may be used for the purpose of randomizing a binary codeword, i.e., increasing its entropy. According to the one or more embodiments, binary messages may be randomly generated through the scrambling, i.e., the remaining bits of the punctured message may be scattered using a random pattern.

In one or more embodiments, the remaining bits of the punctured message may be scrambled using a pseudo-random noise (PN) sequence, for example. The PN sequence, one of available scrambling sequences, may equalize the ratio of the binary one and zero bits, obtained from the remaining bits of the punctured message, of the scrambled message to 0.5. For example, each segment of the PN sequence may have, on average, an equal number of ones and zeros.

In one or more embodiments, the scrambling may be performed by multiplying only the remaining bits of the punctured message by the PN sequence, i.e., the binary ones and zeros of the indicated remaining N(1−p) bits of the punctured message. Accordingly, in one or more embodiments, when the number of remaining bits of the punctured message is N(1−p) bits, the scrambling may be applied to only those N(1−p) bits of the punctured message. Therefore, the length of the PN sequence may be equal to the number of remaining bits of the punctured message, i.e., N(1−p) bits.

In one or more embodiments, the ratio of binary ones and zeros making up the ultimate scrambled message may correspond to the desired dimming rate. In detail, in an embodiment, the ratio of the binary ones and the binary zeros of the result of the scrambling of the N(1−p) bits of the punctured message with the PN sequence, may be about 0.5, e.g., equal. That is, in the ultimately scrambled message, there may be $$\frac{N(1-p)}{2}$$

or Nd binary one bits. In this case, binary ones in the scrambled message may be randomly distributed. Accordingly, when the binary ones of the scrambled message are randomly distributed and the scrambled message is transmitted to the visible light source, the flickering of the visible light source may not be detected by a user. The remaining bits of the ultimately scrambled message may include $$\frac{N(1-p)}{2}$$

binary zero bits, resulting from the scrambling of the N(1−p) bits of the punctured message and the PN sequence, and the Np bits of the punctured or removed bits of the punctured message.

Accordingly, the ultimately scrambled message may be broadcast by the visible light source, in operation 160. In detail, dimming of the visible light source may be set corresponding to the ratio of the binary ones and zeros of the ultimately scrambled message to achieve the desired dimming value or ratio.

One or more embodiments may be applied to not only the VLC but also a radio communication system capable of controlling intensity, such as a radio frequency (RF) communication system, an optical communication system, and an infrared (IR) communication system, as only examples. In detail, an encoded message may be generated from an original message using a predetermined coding method. In addition, a control signal for controlling a broadcasting source may be generated, a puncturing rate corresponding to the control signal may be calculated, and the encoded message may be punctured based on the puncturing rate. Here, the broadcasting source may be an intensity controllable source, including an RF source, an optical source, the light source of the VLC system, and an IR source, as only examples.

In such embodiments, the scrambled message may be generated by scrambling the punctured message and providing the scrambled message to the broadcasting source. Since detailed descriptions of embodiments of error correction, according to one or more embodiments, has been provided above for visible light communication, such further respective error correction applications will not be further described for such alternate embodiments using alternate broadcasting sources.

In one or more embodiments, in a decoding of a broadcasted codeword using error correction, operations 110-160 may equally be performed in reverse order, for example, with transmitted scrambled messages being received and decoded by a corresponding error correction apparatus, for example. In addition to performing operations 110-160 in the reverse order for such a decoding operation, an additional iterative decoding algorithm may be used by the error correction. As only an example, such an iterative decoding algorithm being an iterative BCJR decoding algorithm with 8 iterations FIG. 2 illustrates punctured messages based on an arbitrary pattern, according to one or more embodiments.

Figure 2:
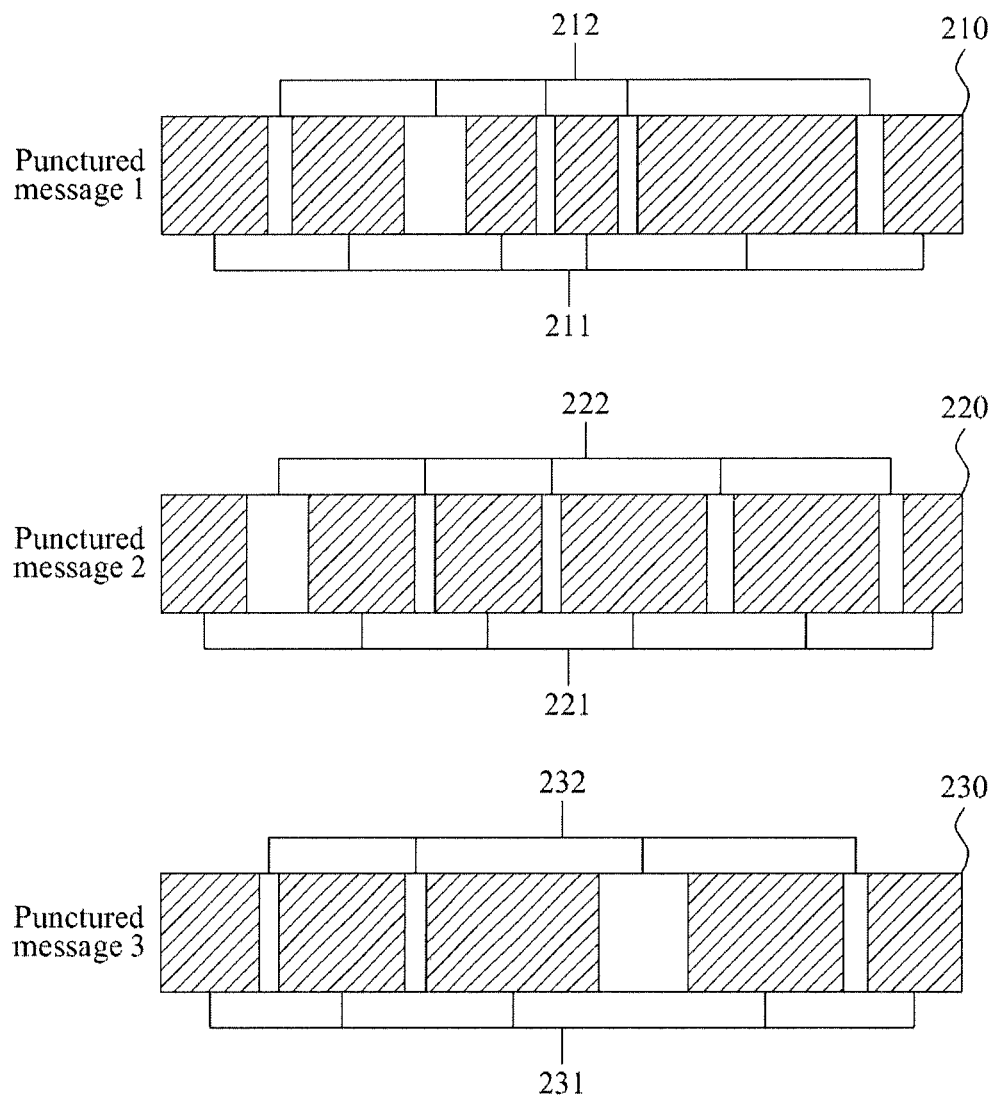
FIG. 2 illustrates punctured messages based on an arbitrary pattern, according to one or more embodiments.

Referring to FIG. 2, a punctured first message 210, punctured second message 220, and punctured third message 230 may refer to punctured messages generated based on a same desired dimming rate. Since a puncturing rate is controlled according to a desired dimming rate, the punctured first message 210, punctured second message 220, and punctured third message 230 may have the same puncturing rate. Therefore, the respective number of bits for each of the punctured bits 212, 222, and 232 may be equal. The respective number of bits for each of the remaining bits 211, 221, and 231 may also be equal.

However, a region of the encoded message may be punctured corresponding to the puncturing rate according to a respectively set arbitrary pattern. Therefore, as only an example, respective sequencing of the punctured bits 212, 222, and 232 in the punctured first through third messages 210 through 230 may have different forms according to the respective set arbitrary patters. Thus, in one or more embodiments, in the punctured first message 210, punctured second message 220, and the punctured third message 230, positions and sequence lengths of the punctured bit sequences 212, 222, and 232 may be different.

In detail, in one or more embodiments that use respective arbitrary patterns, information bits included in the punctured messages may not be removed by the puncturing but may remain as much as possible. Due to the respective arbitrary patterns, the positions and the sequence lengths of the remaining bits in the punctured messages may be irregular. Since a visible light source controls a light emitting diode (LED) using a scramble message based on the punctured messages, a user may not detect the flickering of the visible light source. Furthermore, a transmitter or broadcaster, such as the visible light source, and a receiver, such as a digital device including a smart phone, may be aware of information of the respective arbitrary patterns that are being used and therefore use the information when performing encoding and decoding, according to one or more embodiments.

Figure 3:
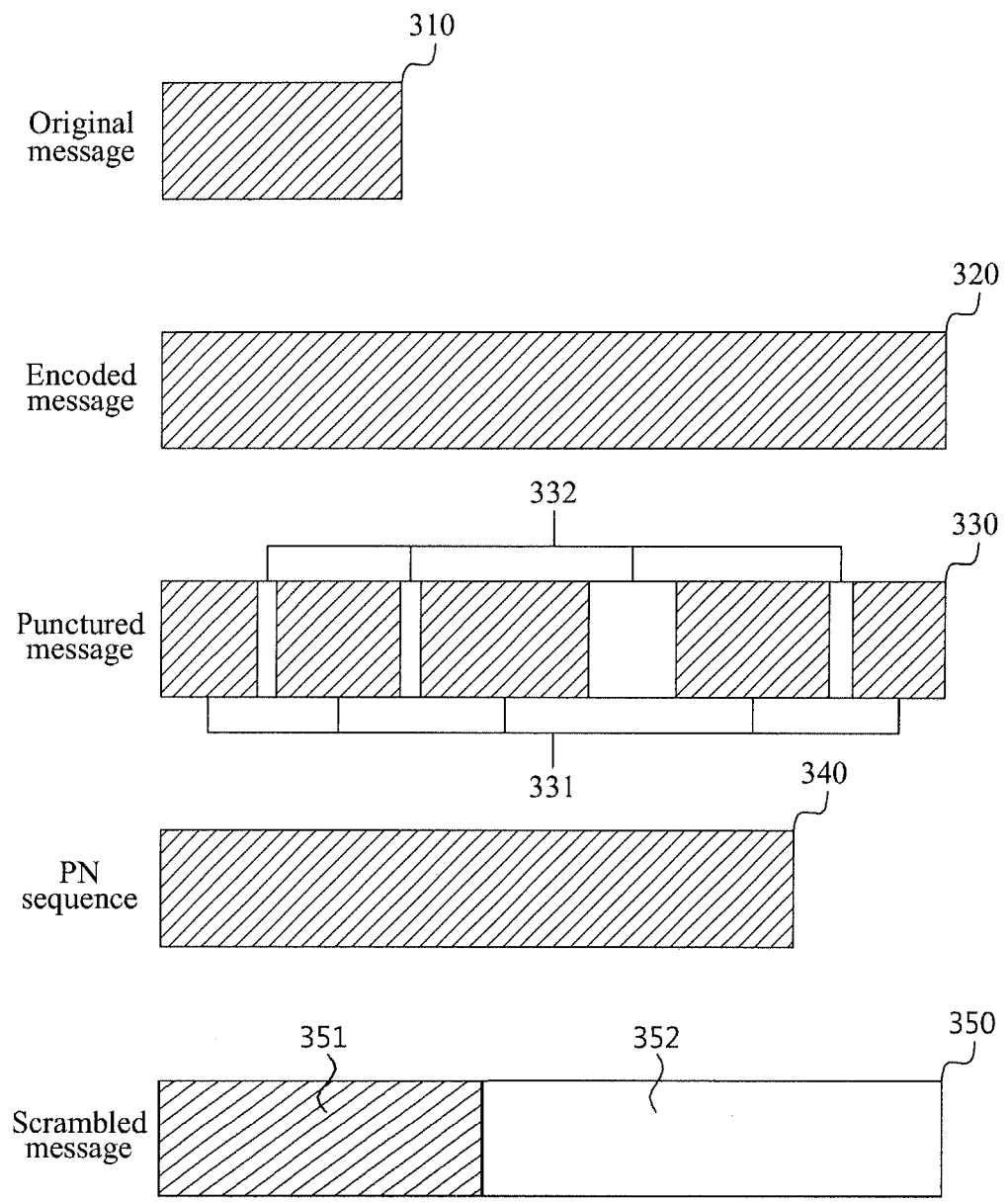
FIG. 3 illustrates an original message, an encoded message, a punctured message, a pseudo-random noise (PN) sequence, and a scrambled message, according to one or more embodiments.

FIG. 3 illustrates an original message 310, an encoded message 320, a punctured message 330, a pseudo-random noise (PN) sequence 340, and a scrambled message 350, according to one or more embodiments.

Referring to FIG. 3, according to one or more embodiments, error correction may be represented by the illustrated original message 310, encoded message 320, punctured message 330, PN sequence 340, and scrambled message 350.

In detail, the original message 310 may include information to be transmitted to a receiver using VLC. In an embodiment, the original message 310 may be information bits having a length of K bits. Here, the encoded message 320 may be generated by trellis-based turbo coding the original message 310, for example. In this case, the encoded message 320 may be represented by N bits. The encoded message 320 may also have a bit length that is determined based on the trellis-based turbo coding. Alternatively, the encoded message 320 may have a predetermined bit length.

The encoded message 320 may be punctured based on a puncturing rate corresponding to a desired dimming rate. In detail, in one or more embodiments, when the encoded message 320 has a length of N bits and the puncturing rate is p, the number of remaining bits 331 of the punctured message 330 may be N(1−p) bits, while the number of punctured bits 332 may be Np bits.

Here, in an embodiment, the encoded message 320 may be punctured according to the puncturing rate using a set arbitrary pattern. Therefore, although puncturing is performed, a maximized amount of the information bits of the original message may be maintained and not removed by the puncturing. In an embodiment, since turbo coding is resistant to puncturing generated errors, error correction using turbo coding may provide a theoretically possible maximum transmission rate.

Additionally, the scrambled message 350 may be generated by multiplying only the remaining bits 331 of the illustrated punctured message 330 by the PN sequence 340. Therefore, the PN sequence 340 may have a bit length of N(1−p) bits, that is, corresponding to the number of remaining bits 331 in the punctured message 330. When the scrambling is performed, $$\frac{N(1-p)}{2}$$

bits of the scrambled message may be binary ones, with the number of binary ones corresponding to a half of the remaining bits 331 of the punctured message. Accordingly, an entire length of the scrambled message 350 may be N bits, which is equal to an entire length of the encoded message 320. The overall number of binary one bits 351 of the scrambled message may be represented by $$\frac{N(1-p)}{2}$$

bits or Nd bits, which is half of the number of remaining bits 331. A number of binary zero bits 352, of the scrambled message 350 may be $$\frac{N(1-p)}{2}$$

binary zero bits, i.e., resulting from the scrambling of the remaining bits 331 of the punctured message, plus the Np punctured bits of the punctured message, or in total N(1−d) or $$\frac{N(1+p)}{2}$$

binary zero bits. Although the binary one bits 351 and the binary zero bits 352 are illustrated as being two distinct bit sequences and distinguished in the scrambled message 350, this is only for a conceptual explanation of the ratio of the number of binary one bits 351 and binary zero bits 352. Therefore, in the one or more embodiments, respective sequences of binary zero bits 352 and binary one bits 351 may be intermixed throughout the scrambled message 350.

Figure 4:
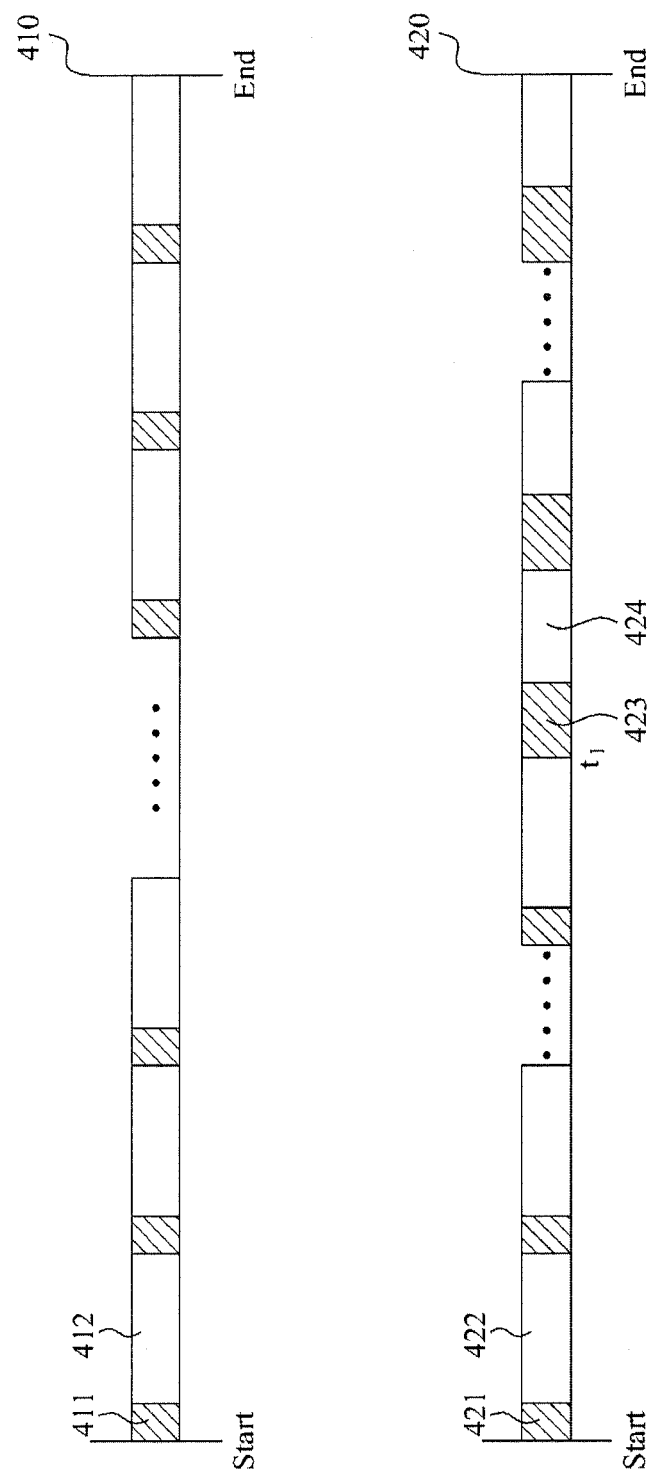
FIG. 4 illustrates a scrambled message in a VLC period, according to one or more embodiments.

FIG. 4 illustrates a scrambled message in a VLC period 410, according to one or more embodiments Referring to FIG. 4, the VLC period 410 may include a start point and an end point of VLC. The VLC period 410 may include a plurality of scrambled messages. A desired dimming rate of the VLC period 410 may be constant. Therefore, ratios of binary one bits 411 and binary zero bits 412 of the scrambled messages may be constant, e.g., corresponding to the dimming rate d. In one or more embodiments, when the length of each of the scrambled messages is N bits and a puncturing rate is p, the number of binary one bits 411 may be $$\frac{N(1-p)}{2}$$

bits or Nd bits while the number of the binary zero bits 412 may be $$\frac{N(1+p)}{2}$$

bits or N(1−d) bits.

When VLC is performed using the scrambled messages, a user may not detect the flickering from the visible light source. In detail, in one or more embodiments, the PN sequences are based on Bernouli random variable Ber $$\left(\frac{1}{2}\right)$$

and the scrambled messages may be generated according to the Bernouli randon variable Ber $$\left(\frac{1}{2}\right),$$

irrespective of an original message. Therefore, the number of binary ones may correspond to a binomial random variable of which an average is $$\frac{N(1-p)}{2}$$

and distribution is $$\frac{N(1-p)}{4}.$$

Accordingly, the visible light source may emit light based on the $$\frac{N(1-p)}{2}$$

binary one bits from among a total of N bits, which is the length of the scrambled message.

To be more specific, in one or more embodiments, when the puncturing rate p is extremely high, as only example, when $$p > \frac{N-K}{N}$$

where p denotes the puncturing rate, N denotes a bit length of the encoded message, and K denotes the length the information bits of the original message, information included in the scrambled messages may not be extracted. To achieve $$p \leq \frac{N-K}{N},$$

a lowest limit of a resultant dimming rate $d_r$ may be determined to be $$\frac{K}{2N}\left(\leq \frac{1}{2}\right).$$

Here, the resultant dimming rate may refer to an actual dimming rate in the scrambled messages. That is, a loss may be generated during the puncturing and the scrambling. When a random variable of the resultant dimming rate $d_r$ of the scrambled messages is calculated using such a lowest limit, the average may be $d_r$ and a standard deviation may be $$\sqrt{\frac{\min(d_r, 1-d_r)}{2N}}\left(\leq \frac{1}{2\sqrt{N}}\right).$$

Since a highest limit of the standard deviation is $$\frac{1}{2\sqrt{N}},$$

the user may not detect the flickering of the visible light source using this. In one or more embodiments, when a pulse of the visible light source is about 150 Hz and an optical clock rate is about 200 kHz, which is a lowest value according to a standard for VLC, conforming to IEEE 802.15.7, 1333 bits may be transmitted during 1/150 second. The standard deviation during 1/150 second may be lower than or equal to $$\frac{1}{2\sqrt{1333}} \approx 0.0137$$

which is a highest limit. Generally, when the pulse changes within a range of 50±50%, the human eye may not detect the flicking of the visible light source. Accordingly, since the pulse changes within a range of 50±1.37% at about 150 Hz, the user may not detect the flicking of the visible light source irrespective of the lengths of the scrambled messages.

The desired dimming rate may be changed at a point of time $t_1$ in the VLC period 420. Therefore, the ratio of the binary ones and binary zeros of the scrambled message generated after the point of time $t_1$ may be different from the ratio of the binary ones and binary zeros of the scrambled message generated before the point of time $t_1$. As only an example, when the length of the scrambled message is N bits and when the desired dimming rate is 0.2 at the start point, e.g., before time $t_1$, and changed to 0.4 at the point of time $t_1$, a puncturing rate before the change may be 0.6 and a puncturing rate of after the change may be 0.2. Therefore, the number of binary one bits 421 of the scrambled messages before the change may be 0.2N bits and the number of binary zero bits 422 may be 0.8N bits. The number of binary one bits 423 of the scrambled messages after the change may be 0.4N bits and the number of binary zero bits 424 may be 0.6N bits. Thus, although the ratio of binary zeros and binary ones is changed according to the desired dimming rate, error correction for VLC may provide the desired dimming while transmitting information to a receiver, without causing performance reduction or requiring a temporary stoppage in provision of the binary ones to the light source. Here, in one or more embodiments, the desired dimming rate may be changed without necessitating a distinct error correction method based on the new desired dimming rate.

Figure 5:
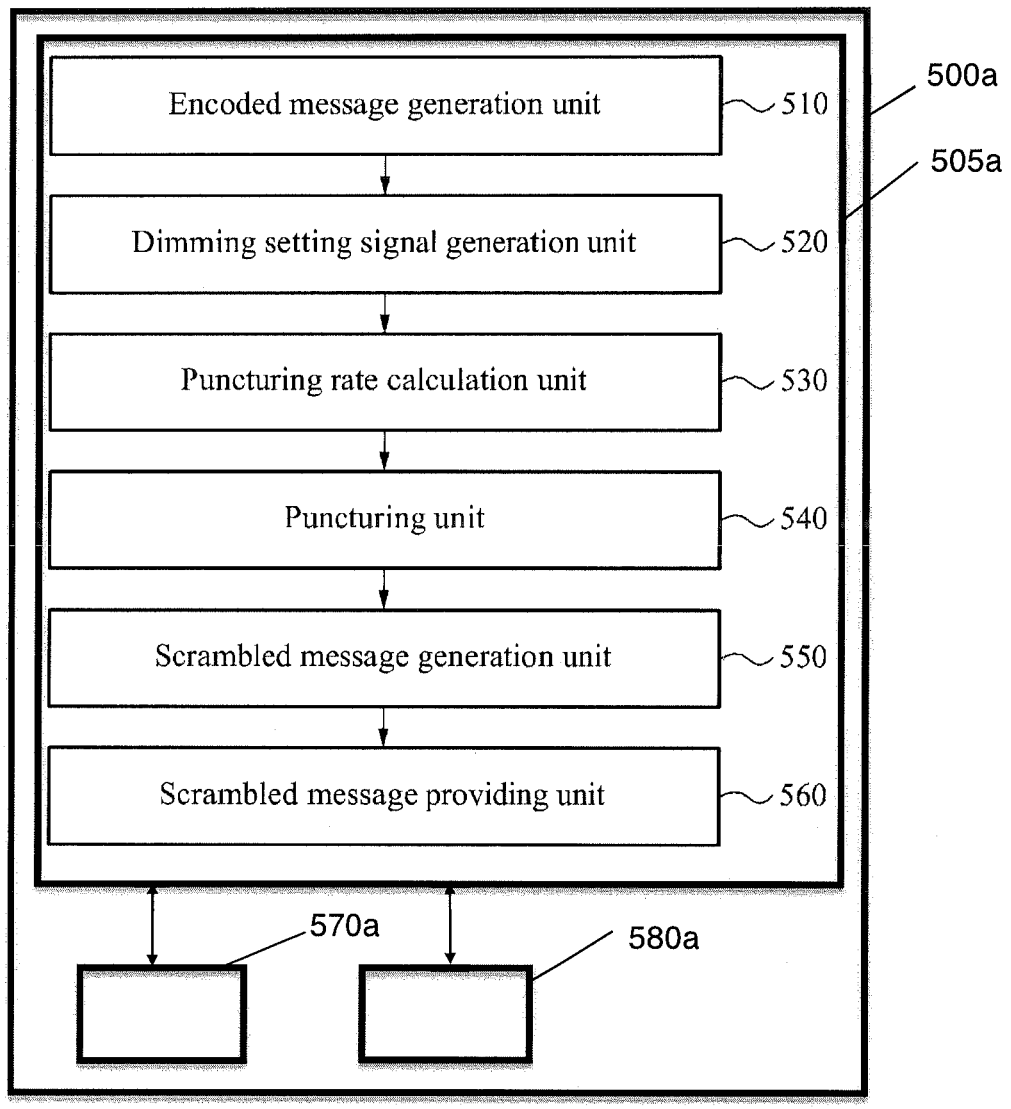
FIG. 5 illustrates error correction apparatuses and corresponding VLC systems, according to one or more embodiments.

FIG. 5 illustrates error correction apparatuses and corresponding VLC systems, according to one or more embodiments. Each of VLC system 500*a* and 500*b* may respectively include error correction apparatuses 505*a* and 505*b*, light source devices 570*a* and 570*b*, and controllers 580*a* and 580*b*. The VLC system 500*a* may represent a primary user/broadcaster, e.g., such as connected to an Internet connection through power lines, and the VLC 500*b* may represent the aforementioned receiver, like a portable electronic device. Below, reference to the components of the error correction apparatus 505*a* will be discussed, e.g., including an encoded message generation unit 510, a dimming setting signal generation unit 520, a puncturing rate calculation unit 530, a puncturing unit 540, and scrambled message generation unit 550, though it is noted that the error correction apparatus 505*b* may include similarly described respective components.

Referring to FIG. 5, the encoded message generation unit 510 may generate an encoded message from an original message, using a predetermined encoding method.

The dimming setting signal generation unit 520 may generate a dimming setting signal for setting dimming of a visible light source, such as setting the dimming rate or value.

The puncturing rate calculation unit 530 may calculate a puncturing rate corresponding to the dimming setting signal, e.g., calculating the puncturing rate based on the dimming rate.

The puncturing unit 540 may puncture the encoded message based on the puncturing rate.

The scrambled message generation unit 550 may generate a scrambled message by scrambling the punctured message.

The scrambled message providing unit 560 may provide the scrambled message to the visible light source.

In addition, in one or more embodiments, the error correction apparatuses 505*a* and 505*b* of VLC systems 500*a* and 500*b*, respectively, may be applied to not only VLC but also any broadcasting communication system capable of controlling a broadcasting intensity, such as an RF communication system, an optical communication system, the VLC, and an IR communication system, as only examples.

The method descriptions made with reference to FIGS. 1 to 4 may be equally applied to the respective components of the error correction apparatuses 505*a* and 505*b* of the respective VLC systems 500*a* and 500*b*, according to one or more embodiments. Therefore, further detailed descriptions regarding the respective configuration controlled operation of each of the encoded message generation unit 510, dimming setting signal generation unit 520, puncturing rate calculation unit 530, puncturing unit 540, and scrambled message generation unit 550 will be omitted.

Accordingly, in one or more embodiments, the error correction is performed by an error correction apparatus, such as the respective error correction apparatuses 505*a* and 505*b* of FIG. 5, within corresponding VLC systems 500*a* and 500*b*, based upon user selection of the desired dimming value or rate using the respective controllers 580*a* and 580*b*. In one or more embodiments, in an encoding using error correction, operations 110-160 may be performed in sequence, for example, and performed by such error correction apparatuses 505*a* and 505*b*, with the resultant scrambled messages being forward and transmitted by the respective light source devices 570*a* and 570*b*, which may respectively be LEDs as light sources. In one or more embodiments, in a decoding using error correction, operations 110-160 may be performed in reverse order, for example, and similarly performed by such error correction apparatuses 505*a* and 505*b*, with transmitted scrambled messages being received by a light detection element, e.g., embodied in the respective light source devices 570*a* and 570*b*, and forwarded to the respective error correction apparatuses 505*a* and 505*b*. The controllers 580*a* and 580*b* may include user interfaces for receiving user input for varied dimming rates or values. In addition, if a user input is not received a default dimming value or dimming rate may be automatically used. In an embodiment, the above noted Internet connection may be accessed using such user interfaces, e.g., so the user can send, receive, or display data corresponding to the information that is encoded in operation 110 or decoded in an inverse of operation 110.

Depending on embodiment, apparatuses, systems, and units descriptions herein may respectively include one or more hardware devices or hardware processing elements. For example, in one or more embodiments, any described apparatus, system, and unit may further include one or more desirable memories, and any desired hardware input/output transmission devices. Further, the term apparatus should be considered synonymous with elements of a physical system, not limited to a single device or enclosure or all described elements embodied in single respective enclosures in all embodiments, but rather, depending on embodiment, is open to being embodied together or separately in differing enclosures and/or locations through differing hardware elements.

In addition to the above described embodiments, embodiments can also be implemented by at least one processing device, such as a processor or computer. Further to the above described embodiments, embodiments can also be implemented through computer readable code/instructions in/on a non-transitory medium, e.g., a computer readable medium, to control at least one processing device, such as a processor or computer, to implement any above described embodiment. The medium can correspond to any defined, measurable, and tangible structure permitting the storing and/or transmission of the computer readable code.

The media may also include, e.g., in combination with the computer readable code, data files, data structures, and the like. One or more embodiments of computer-readable media include: magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Computer readable code may include both machine code, such as produced by a compiler, and files containing higher level code that may be executed by the computer using an interpreter, for example. The media may also be any defined, measurable, and tangible distributed network, so that the computer readable code is stored and executed in a distributed fashion. Still further, as only an example, the processing element could include a processor or a computer processor, and processing elements may be distributed and/or included in a single device. The processing element may be a specially designed computing device to implement one or more of the embodiments described herein.

The computer-readable media may also be embodied in at least one application specific integrated circuit (ASIC) or Field Programmable Gate Array (FPGA), as only examples, which execute (processes like a processor) program instructions.

While aspects of the present invention has been particularly shown and described with reference to differing embodiments thereof, it should be understood that these embodiments should be considered in a descriptive sense only and not for purposes of limitation. Descriptions of features or aspects within each embodiment should typically be considered as available for other similar features or aspects in the remaining embodiments. Suitable results may equally be achieved if the described techniques are performed in a different order and/or if components in a described system, architecture, device, or circuit are combined in a different manner and/or replaced or supplemented by other components or their equivalents.

Thus, although a few embodiments have been shown and described, with additional embodiments being equally available, it would be appreciated by those skilled in the art that changes may be made in these embodiments without departing from the principles and spirit of the invention, the scope of which is defined in the claims and their equivalents.

What is claimed is:

1. A visible light communication method, the method comprising:
    encoding an information message using a predetermined error correction coding scheme that has a bit length N (where N is a positive integer) different from a bit length of the information message;
    puncturing the encoded message based on a desired dimming rate and a set pattern, with the punctured message including non-punctured bits and punctured bits;
    generating a scrambled message by scrambling the non-punctured bits of the punctured message and combining the scrambled non-punctured bits with the punctured bits of the punctured message; and
    providing the scrambled message to a visible light source.

2. The method of claim 1, wherein the predetermined error correction coding minimizes a generation of errors during the puncturing of the encoded message.

3. The method of claim 2, wherein the predetermined error correction coding method is trellis-based turbo coding.

4. The method of claim 1, wherein the scrambling of the non-punctured bits equalizes a resultant total number of binary ones and a resultant total number of binary zeros in the scrambled non-punctured bits.

5. The method of claim 1, wherein the puncturing of the encoded message includes setting all of the punctured bits to binary zero.

6. The method of claim 1, wherein the punctured message and the scrambled message have respective bit lengths of N.

7. The method of claim 6, wherein a total number of non-punctured bits is based upon the desired dimming rate and is less than N, and the generating of the scrambled message includes scrambling the non-punctured bits with a bit sequence having a bit length that is dependent on the total number of non-punctured bits and less than N.

8. The method of claim 7, wherein the puncturing of the encoded message includes setting the punctured bits to binary zero, and the generating of the scrambled message includes combining the punctured bits and the scrambled non-punctured bits, wherein the scrambling of the non-punctured bits includes equalizing a resultant total number of binary ones and a resultant total number of binary zeros in the scrambled non-punctured bits.

9. The method of claim 1, wherein the predetermined coding method is trellis-based turbo coding.

10. The method of claim 1, further comprising:
    determining a dimming setting signal upon on a user providing a desired dimming value of the visible light source or upon the user providing the desired dimming rate; and
    determining the dimming setting signal to be a predetermined default value when it is determined that the user has not provided the desired dimming value or determining the dimming setting signal to be a predetermined default rate when it is determined that the user has not provided the desired the desired dimming rate.

11. The method of claim 10, further comprising:
    extracting the desired dimming rate from the dimming setting signal when the desired dimming value is provided by the user.

12. The method of claim 1, wherein the punctured message comprises binary ones and zeros being combined and randomly distributed.

13. The method of claim 1, wherein the generating of the scrambled message comprises:
    performing the scrambling by multiplying the non-punctured bits of the punctured message by a pseudo-random noise (PN) sequence.

14. The method of claim 13, wherein a bit length of the PN sequence is dependent on a total number of non-punctured bits of the punctured message.

15. The method of claim 1, wherein the scrambled message includes binary one bits and binary zero bits, and the generating of the scrambled message is performed to match a ratio of a total of the binary one bits and the binary zero bits of the scrambled message to the desired dimming rate.

16. A non-transitory computer readable recording medium including computer readable code to control at least one processing device to implement the method of claim 1.

17. A visible light communication system, the system comprising:
    an encoding unit to encode an information message using a predetermined error correction coding scheme that has a bit length N (where N is a positive integer) different from a bit length of the information message;
    a puncturing unit to puncture the encoded message based on a desired dimming rate and a set pattern, with the punctured message including non-punctured bits and punctured bits; and
    a scrambled generating unit to generate a scrambled message by scrambling the non-punctured bits of the punctured message and combining the scrambled non-punctured bits with the punctured bits of the punctured message.

18. The system of claim 17, further comprising a visual light source, wherein the system is configured to provide the scrambled message to the visible light source for visual light communication.

19. The system of claim 17, further comprising a user input, wherein the system is configured to calculate the desired dimming rate based upon a user inputting a desired dimming value.

* * * * *